(12) United States Patent
Baritkar et al.

(10) Patent No.: US 8,705,764 B2
(45) Date of Patent: Apr. 22, 2014

(54) AUDIO CONTENT ENHANCEMENT USING BANDWIDTH EXTENSION TECHNIQUES

(75) Inventors: Sunil Baritkar, Los Angeles, CA (US); Nathan Dahlin, Los Angeles, CA (US); Ismael Hamad Nawfal, Los Angeles, CA (US); Chris Kyriakakis, Altadena, CA (US)

(73) Assignee: Audyssey Laboratories, Inc., Los Angeles, CA (US)

( * ) Notice: Subject to any disclaimer, the term of this patent is extended or adjusted under 35 U.S.C. 154(b) by 539 days.

(21) Appl. No.: 12/914,918

(22) Filed: Oct. 28, 2010

(65) Prior Publication Data
US 2012/0106742 A1 May 3, 2012

(51) Int. Cl.
*H03G 5/00* (2006.01)

(52) U.S. Cl.
USPC .......................................... 381/101

(58) Field of Classification Search
USPC .......................................... 381/101
See application file for complete search history.

(56) References Cited

U.S. PATENT DOCUMENTS

| | | | |
|---|---|---|---|
| 3,067,297 A | 12/1962 | Fink | |
| 4,109,107 A | 8/1978 | Boast | |
| 4,514,596 A | 4/1985 | Garner et al. | |
| 4,694,498 A | 9/1987 | Suzuki et al. | |
| 4,698,842 A | 10/1987 | Mackie et al. | |
| 4,771,466 A | 9/1988 | Modafferi | |
| 4,888,809 A | 12/1989 | Knibbeler | |
| 4,908,868 A | 3/1990 | McTaggart | |
| 5,185,801 A | 2/1993 | Meyer et al. | |
| 5,319,714 A | 6/1994 | McTaggart | |
| 5,377,274 A | 12/1994 | Meyer et al. | |
| 5,572,443 A | 11/1996 | Emoto et al. | |
| 5,627,899 A | 5/1997 | Craven et al. | |
| 5,771,294 A | 6/1998 | Inoue et al. | |
| 5,815,580 A | 9/1998 | Craven et al. | |
| 5,930,373 A | 7/1999 | Shashoua et al. | |
| 5,930,374 A | 7/1999 | Werrbach et al. | |
| 6,064,770 A | 5/2000 | Scarth et al. | |
| 6,072,877 A | 6/2000 | Abel | |
| 6,118,875 A | 9/2000 | Moller et al. | |
| 6,134,330 A | 10/2000 | De Poortere et al. | |
| 6,519,344 B1 | 2/2003 | Yajima et al. | |
| 6,650,756 B1 | 11/2003 | Saito et al. | |

(Continued)

OTHER PUBLICATIONS

Bhariktar, Sunil, A Classification Scheme for Acoustical Room Responses, IEEE, Aug. 2001, 2:671-674.

(Continued)

*Primary Examiner* — Alexander Jamal
(74) *Attorney, Agent, or Firm* — Goodwin Procter LLP

(57) ABSTRACT

Methods, devices and computer program products facilitate the generation of high quality audio content. The audio content includes upper harmonics that are associated with a bass band of frequencies in order to enhance the perception of bass audio components that cannot be produced by the audio speakers. The upper harmonics are generated and processed in such a way that reduces the computational and memory requirements of the audio processing operations. The processed upper harmonics are combined with the original audio that are properly delayed to enhance the quality of the audio content. This Abstract is provided for the sole purpose of complying with the Abstract requirement rules that allow a reader to quickly ascertain the disclosed subject matter. Therefore, it is to be understood that it should not be used to interpret or limit the scope or the meaning of the claims.

36 Claims, 13 Drawing Sheets

(56) References Cited

U.S. PATENT DOCUMENTS

| | | |
|---|---|---|
| 6,650,776 B2 | 11/2003 | Ihara et al. |
| 6,681,019 B1 | 1/2004 | Kitano et al. |
| 6,721,428 B1 | 4/2004 | Allred et al. |
| 6,760,451 B1 | 7/2004 | Craven et al. |
| 6,792,114 B1 | 9/2004 | Kates et al. |
| 6,854,005 B2 | 2/2005 | Thiele |
| 6,956,955 B1 | 10/2005 | Brungart |
| 6,980,665 B2 | 12/2005 | Kates |
| 7,158,643 B2 | 1/2007 | Lavoie et al. |
| 7,567,675 B2 | 7/2009 | Bharitkar et al. |
| 7,574,009 B2 | 8/2009 | Aubauer et al. |
| 7,720,237 B2 | 5/2010 | Bharitkar et al. |
| 7,769,183 B2 | 8/2010 | Bharitkar et al. |
| 7,826,626 B2 | 11/2010 | Bharitkar et al. |
| 2001/0038702 A1 | 11/2001 | Lavoie et al. |
| 2003/0112981 A1 | 6/2003 | McWilliam et al. |
| 2003/0200236 A1 | 10/2003 | Hong |
| 2003/0235318 A1 | 12/2003 | Bharitkar et al. |
| 2005/0031135 A1 | 2/2005 | Devantier et al. |
| 2005/0069153 A1 | 3/2005 | Hall et al. |
| 2005/0094821 A1 | 5/2005 | Bharitkar et al. |
| 2005/0157891 A1 | 7/2005 | Johansen |
| 2005/0220312 A1 | 10/2005 | Kasai et al. |
| 2006/0056646 A1 | 3/2006 | Bharitkar et al. |
| 2006/0062404 A1 | 3/2006 | Bharitkar et al. |
| 2007/0299655 A1* | 12/2007 | Laaksonen et al. ........... 704/205 |
| 2009/0202082 A1 | 8/2009 | Bharitkar et al. |
| 2010/0189282 A1 | 7/2010 | Bharitkar et al. |
| 2010/0310092 A1 | 12/2010 | Bharitkar et al. |

OTHER PUBLICATIONS

Bharitkar et al, Multiple Point Room Response Equalization Using Clustering, Apr. 24, 2001, pp. 1-24.

Bharitkar, S., A Cluster Centroid Method for Room Response Equilization at Multiple Locations, Applications of Signal Processing to Audio and Acoustics, Oct. 2001, pp. 55-58.

Brandenstein et al, Least-Squares Approximation of FIR by IIR Digital Filters, IEEE Transactions on Signal Processing, 46(1):21-30 (1998).

Elliot, Multiple-Point Equalization in a Room Using Adaptive Digital Filters. Journal of Audio Engineering Society, Nov. 1989, 37:899-907.

Hatziantoniou et al, Results for Room Acoustics Equalisation Based on Smooth Responses, Audio Group. Electrical and Computer Engineering Department, University of Patras, (date unknown).

http://www.snellacoustics.com/IRCSI000.htm. Snell Acoustics RCS 1000 Digital Room Correction System (date unknown).

International Search Report dated Oct. 3, 2003 for PCT/US03/16226.

Kumin, Daniel, Snell Acoustics RCS 1000 Room-Correction System, Audio, Nov. 1997, 81(11):96-102.

Radlovic et al, Nonminimum-Phase Equalization and Its Subjective Importance in Room Acoustics, IEEE Transactions on Speech and Audio Processing, 8(6):728-373, Nov. 2000.

Yang et al, Auditory Representations of Acoustic Signals, IEEE Transactions on Information Theory, 38(2):824-839 (1992).

* cited by examiner

AUDIO CONTENT ENHANCEMENT USING BANDWIDTH EXTENSION TECHNIQUES

FIELD OF INVENTION

The disclosed embodiments generally relate to the field of audio processing. More particularly, the disclosed embodiments relate to the restoration of low frequency components of an audio content.

BACKGROUND

This section is intended to provide a background or context to the disclosed embodiments that are recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Accurate reproduction of audio content is an important goal of any audio playback system. To achieve this goal, various high fidelity audio equipment have been developed to process and subsequently reproduce an audio content while preserving and, sometimes, enhancing the characteristics of the original audio content. These efforts for enhancing the listener's audio experience often requires the use of expensive audio processing equipment and multi-channel speaker systems. However, with the increasing popularity of desktop, laptop and portable devices for accessing and playback of music, movies and other multi-media content, high-fidelity reproduction of audio content using relatively inexpensive speaker systems has become more important.

One of the challenges associated with using inexpensive speakers for audio playback relates to the reproduction of the bass components of an audio signal. A bass signal occupies the low-end of the human auditory range (i.e., approximately the frequency range between 20-200 Hz) which often carries important portions of the overall audio content. For example, appreciable portions of a speech signal, and especially those corresponding to male voices, are present in the bass range of frequencies, as well as other bass frequencies in signals from musical instruments and special effects, such as explosions. Inexpensive audio speakers, however, cannot reproduce all of the bass components due to physical limitations. These limitations arise since the speaker transducer dimensions are typically much smaller than the wavelengths associated with the audio base components. To overcome these limitations, high-end speaker systems often utilize sub-woofers that, although more expensive, are physically capable of adequately reproducing the bass content.

Alternative methods have also been developed to improve the sound reproduction quality at the lower end of the audible range without the use of a sub-woofer. One such technique uses a psycho-acoustic phenomenon, known as "the missing fundamental," to create the perception of hearing low frequencies by generating audio components in a higher frequency range. For example, a listener may still perceive a missing fundamental frequency component of say, 100 Hz, if higher harmonics at say, 200 Hz, 300 Hz, 400 Hz, etc., are present at sufficient amplitudes. As such, a speaker system can create the perception of a bass component by generating the proper higher order harmonics of the bass content.

SUMMARY

This section is intended to provide a non-exhaustive summary of certain exemplary embodiments and is not intended to limit the scope of the embodiments that are disclosed in this application.

The disclosed embodiments relate to systems, methods, devices, and computer program products that enable the production of high fidelity audio that can be implemented inexpensively. The disclosed embodiments enable the production of higher harmonics that are combined, with proper phase alignments, with the audio content.

One aspect of the disclosed embodiments relates to a method for producing such an enhanced audio content. Such a method includes performing a wet chain processing on an input audio content. The wet chain processing includes producing upper harmonics associated with a first frequency band of the input audio content, where the upper harmonics are located in a second frequency band. The wet chain processing also includes filtering the upper harmonics using an infinite impulse response bandpass filter to produce a wet chain audio component. The above noted method also includes performing a dry chain processing on the input audio content. The dry chain processing includes generating a dry chain group delay to match a wet chain group delay associated with the infinite impulse response bandpass filter, and applying the dry chain group delay to the input audio content to produce a dry chain audio component. The above noted method further provides for combining the wet chain audio component with the dry chain audio component.

In one embodiment, the dry chain group delay is generated using at least one all-pass filter to produce a group delay in the second band of frequencies. Such a group delay matches the group delay associated with the infinite impulse response bandpass filter of the wet chain. In one example, each all-pass filter is a second-order all-pass filter, and each such all pass filter is configured to exhibit a particular group delay characteristic in a sub-band of frequencies within the second band of frequencies.

In another embodiment, the wet chain processing includes filtering the input audio content to produce the first band of frequencies. In such an embodiment, the first band of frequencies is produced using a first infinite impulse response filter. Further, the dry chain processing includes generating the dry chain group delay by matching a wet chain group delay associated with the first infinite impulse response bandpass filter of the wet chain.

According to another embodiment, the wet chain processing includes spectral shaping of the wet chain audio component. In particular, the spectral shaping can be carried out using a parametric filter. For example, the parametric filter can be configured to emphasize a lower sub-band of frequencies within the second band of frequencies. In still another embodiment, the wet chain processing also includes generating and applying a delay to the wet chain audio component prior to combining the wet and dry chain audio components. According to another embodiment, the wet chain processing can include generating and applying a gain to wet chain audio component prior to the combining the wet and dry chain audio components. In yet another embodiment, the dry chain processing includes generating and applying a gain to the dry chain audio component prior to the combining the wet and dry audio components.

In one embodiment, the input audio content is a single-channel audio content, and the dry chain processing and wet chain processing are carried out on the single-channel audio content. In another embodiment, the input audio content is a multi-channel audio content, and the dry chain processing and wet chain processing are carried out on individual channels of the multi-channel audio content. In still another embodiment, the input audio content is a multi-channel audio content, the dry chain processing is carried out on individual channels of the multi-channel audio content; and at least a portion of the wet chain processing is carried out on a combined audio content that comprises two or more of the channels of the multi-channel audio content.

Another aspect of the disclosed embodiments relates to a device that includes a processor and a memory that includes processor executable code. The processor executable code, when executed by the processor, configures the device to perform a wet chain processing on an input audio content by configuring the device to produce upper harmonics associated with a first frequency band of the input audio content (where the upper harmonics being located in a second frequency band), and to filter the upper harmonics using an infinite impulse response bandpass filter to produce a wet chain audio component. The processor executable code, when executed by the processor, also configures the device to perform a dry chain processing on the input audio content by configuring the device to generate a dry chain group delay to match a wet chain group delay associated with the infinite impulse response bandpass filter, and to apply the dry chain group delay to the input audio content to produce a dry chain audio component. The processor executable code, when executed by the processor, further configures the device to combine the wet chain audio component with the dry chain audio component.

Another aspect of the disclosed embodiments relates to a computer program product that is embodied on a non-transitory computer readable medium. The computer program product includes computer code for performing a wet chain processing on an input audio content. The wet chain processing includes producing upper harmonics associated with a first frequency band of the input audio content (where the upper harmonics are located in a second frequency band), and filtering the upper harmonics using an infinite impulse response bandpass filter to produce a wet chain audio component. The computer program product also includes computer code for performing a dry chain processing on the input audio content. The dry chain processing includes generating a dry chain group delay to match a wet chain group delay associated with the infinite impulse response bandpass filter, and applying the dry chain group delay to the input audio content to produce a dry chain audio component. The computer program product further includes computer code for combining the wet chain audio component with the dry chain audio component.

These and other advantages and features of the disclosed embodiments, together with the organization and manner of operation thereof, will become apparent from the following detailed description when taken in conjunction with the accompanying drawings.

BRIEF DESCRIPTION OF THE DRAWINGS

The disclosed embodiments are described by referring to the attached drawings, in which.

DETAILED DESCRIPTION OF CERTAIN EMBODIMENTS

In the following description, for purposes of explanation and not limitation, details and descriptions are set forth in order to provide a thorough understanding of the disclosed. However, it will be apparent to those skilled in the art that the present invention may be practiced in other embodiments that depart from these details and descriptions.

Additionally, in the subject description, the word "exemplary" is used to mean serving as an example, instance, or illustration. Any embodiment or design described herein as "exemplary" is not necessarily to be construed as preferred or advantageous over other embodiments or designs. Rather, use of the word exemplary is intended to present concepts in a concrete manner.

As noted earlier, higher order harmonic components can be generated to mimic the presence of lower frequencies that cannot be adequately produced by inexpensive audio equipment. Such higher order components, once generated, are combined with the original audio content. It is important, however, to ensure that the higher order harmonics have the proper magnitude and are combined with the original audio with the proper time alignment. It is also important to generate such harmonics with the proper magnitude and phase characteristics while minimizing the computational complexity of the audio processing operations. The reduction of computational cycles and memory usage can be significant factors in implementations within, for example, mobile devices that have a limited memory, processing capability and battery life.

Figure 1:
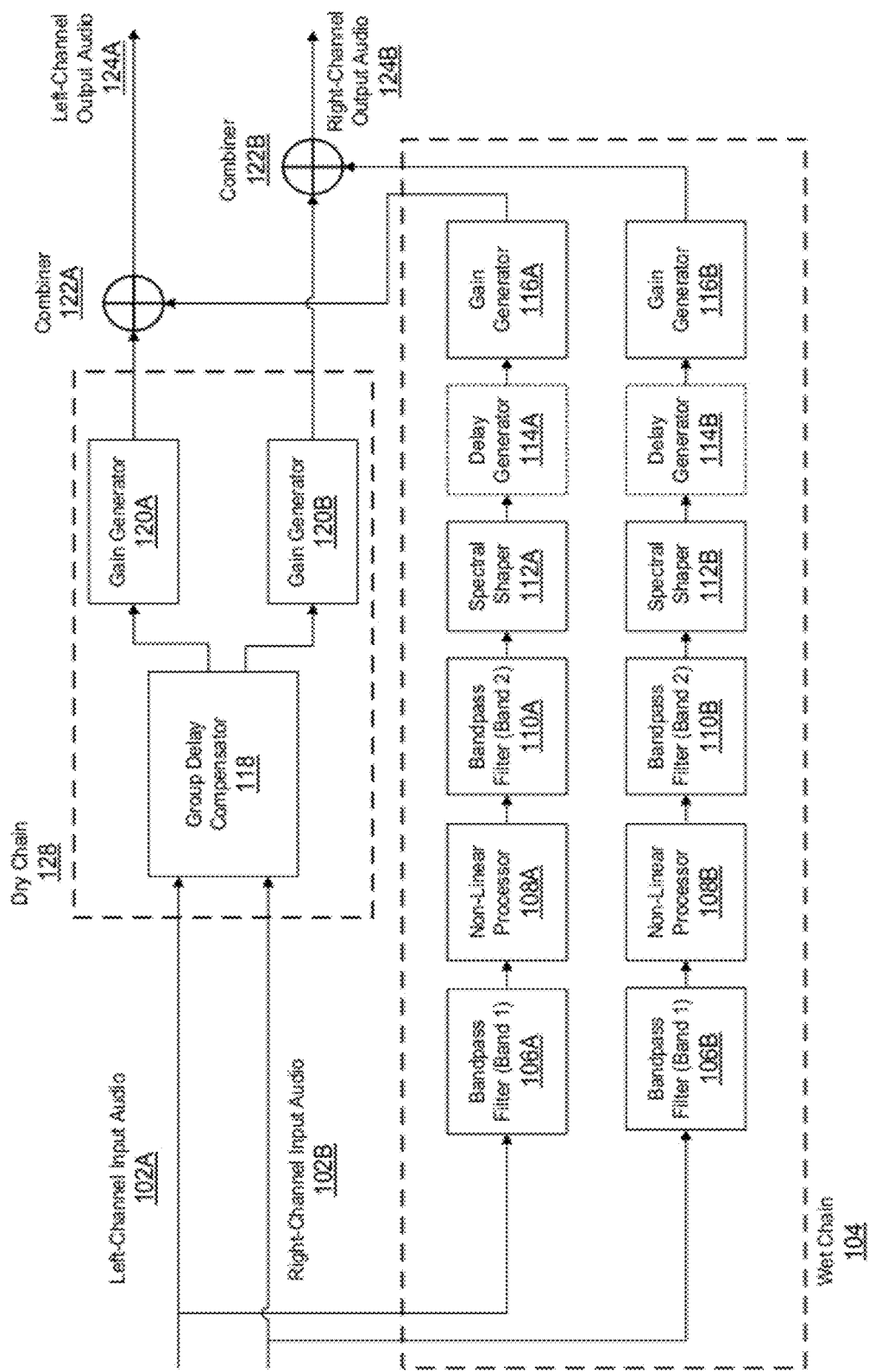
FIG. 1 illustrates a system that is used to generate an enhanced audio content in accordance with an example embodiment.

The disclosed embodiments enable the generation of an enhanced audio output by generation higher order harmonics that are properly combined with an input audio content while minimizing the usage of computational resources. FIG. 1 illustrates some of the components that are used to generate such an enhanced audio content according to an exemplary embodiment. The specific configuration of the audio processing apparatus that is depicted in FIG. 1 relates to the generation of an enhanced audio output for a stereo input content comprising a left-channel audio input 102A and a right-channel audio input 102B. Each of the left and right audio channels are processed by the various components or processes labeled 106 to 116 in the wet-channel chain 104. In particular, the left-channel audio input 102A is first processed by the first bandpass filter 106A, which isolates the frequencies in one particular range, i.e., band 1. By the way of example, and not by limitation, band 1 may comprise frequencies in the range 80-150 Hz. In one embodiment, the first bandpass filter 106A is an Finite Impute Response (FIR) filter. In another embodiment, the first bandpass filter 106A is a quasi-linear phase Infinite Impulse Filter (IIR). Further details regarding the first bandpass filter 106A will be described in the sections that follow. The characteristics of FIR and IIR filters, as well as the advantages of one over the other, are well known in the area of signal processing and will not be elaborated in detail. However, it is important to note that while FIR filters are inherently stable and can be readily designed to produce a linear phase, they often require considerably more computational cycles and memory usage than IIR filters with similar filtering characteristics.

Figure 3:
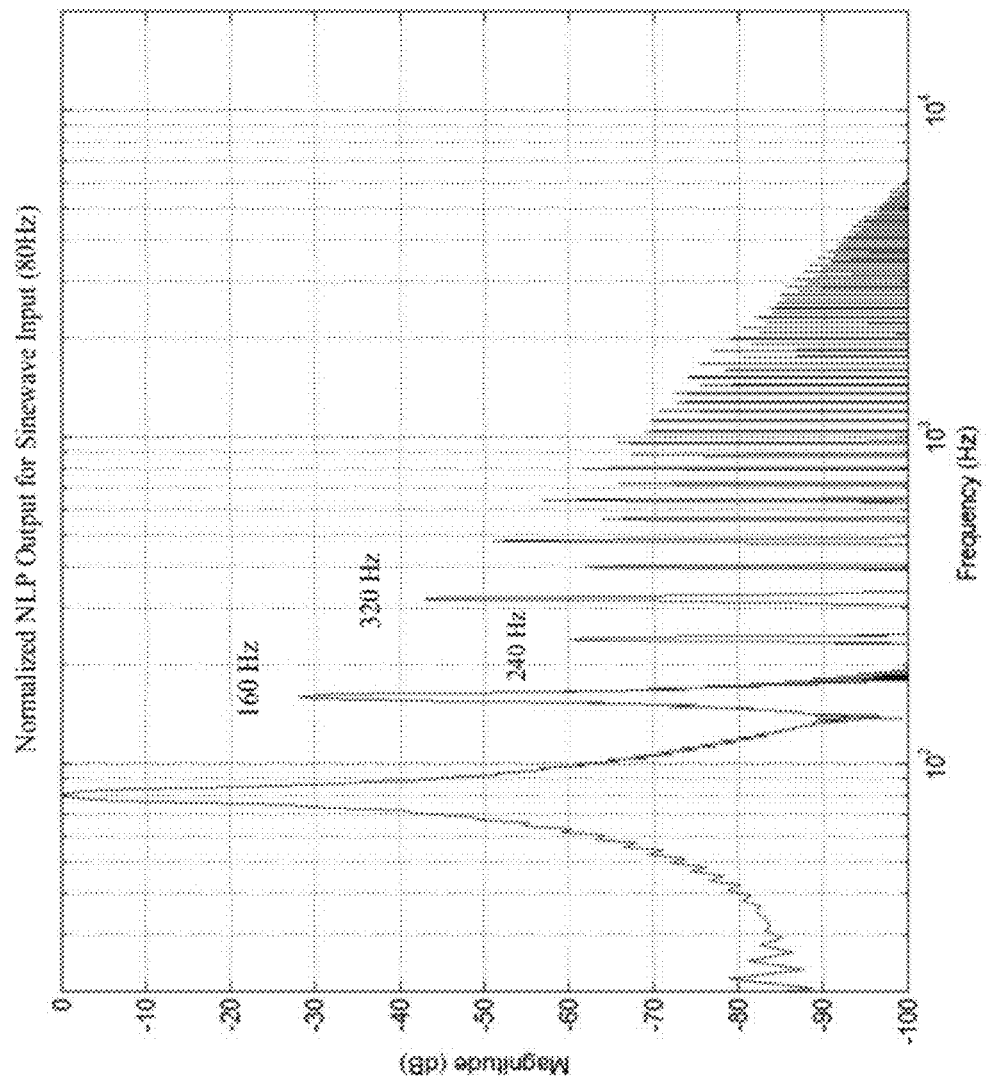
FIG. 3 is a plot of an audio content containing higher order harmonics that is generated in accordance with an example embodiment.

Referring back to FIG. 1, the output of the first bandpass filter 106A is processed by the non-linear processor 108A. The non-linear processor 108A is configured to produce higher harmonics associated with the frequency content of band 1. By the way of example, and not by limitation, the non-linear processor 108A may be configured to generate the higher order harmonics, even and odd, by using a smoother with adjustable rising and falling time constants. The output of the smoother is based on both the present input signal and a previously smoothed output signal. The proportion between the two input signals can depend on whether the signal is increasing or decreasing and on the time constants. In another embodiment, the non-linear processor 108A can use half- and full-wave rectification procedures, while in other embodiments integration and clipping methods can be used to produce the higher order harmonics. FIG. 3 is an exemplary plot of the normalized output of the non-linear processor (NLP) 108A that is produced from an 80 Hz input sinewave. As evident from the exemplary plot of FIG. 3, the non-linear processor (NLP) 108A has produced higher order harmonics (e.g., at 160 Hz, 240 Hz, etc.)

Returning to FIG. 1, the second bandpass filter 110A receives the input from the non-linear processor 108A that comprises both the frequency components in band 1 and the associated higher order harmonics. The second bandpass filter 110A, next, processes its input to isolate the higher order harmonics that reside in band 2. By the way of example, and not by limitation, band 2 may comprise frequencies in the range 150-300 Hz. In one embodiment, the second bandpass filter 110A is an FIR filter. In another embodiment, the second bandpass filter 110A is a quasi-linear phase IIR filter.

Figure 4:
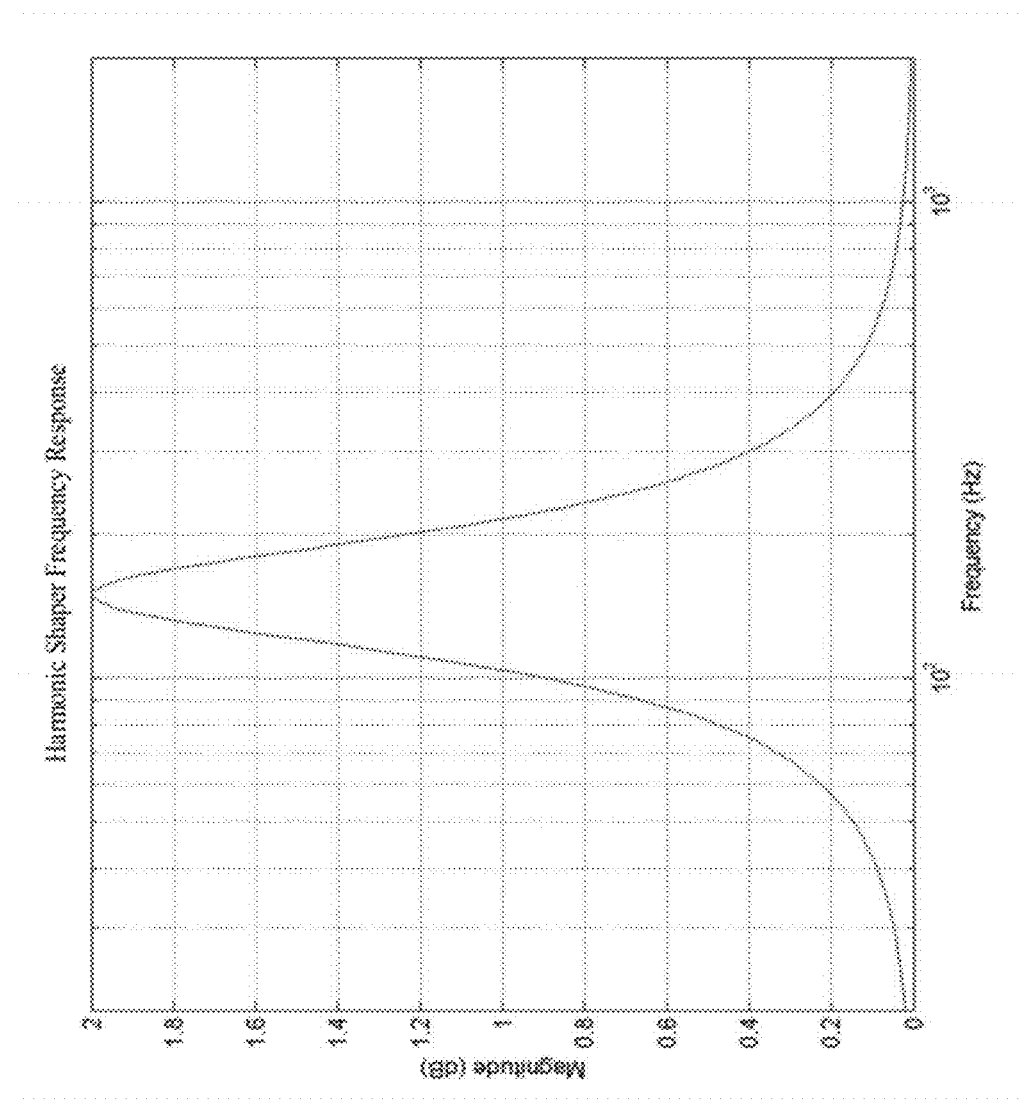
FIG. 4 illustrates the frequency response of a harmonic shaping in accordance with an example embodiment.

The output of the second bandpass filter 110A is next processed by the spectral shaper 112A. The spectral shaper 112A is configured to shape the spectrum of the higher harmonics in band 2. In one example, the spectral shaper 112A serves to level out the lower frequency range of harmonics that are passed through the second bandpass filter 110A. In one example, the spectral shaper 112A implements an IIR spectral shaping filter. Depending on the order of the bandpass filter 110A, there exists a certain degree of rolloff within the passband of the second bandpass filter 110A approaching the cutoff frequencies. In one embodiment, the spectral shaper 112A of FIG. 1 is configured to implement a spectral shaping filter that is centered near the lower cutoff frequency of the second passband filter 110A. In this configuration, the shaping filter emphasizes the lower frequency components of the wet chain prior to the summation with the dry chain signals. The spectral shaping filter that is implemented by the spectral shaper 112A can be a parametric filter and centered with respect band 2. Further, the Q factor and the gain associated with the spectral shaping filter can be tuned to produce the desired aural effects. For example, the tuning of the spectral shaping filter can be carried out through listening tests. FIG. 4 is an exemplary plot of the spectral shaper frequency response that may be applied to the band 2 harmonics of 150-300 Hz frequency range. In the exemplary plot of FIG. 4, the spectral shaper center frequency is 150 Hz, with a sharp rolloff on either side of this center frequency.

FIG. 1 further illustrates that the output of the spectral shaper is processed by the delay generator 114A. The delay generator 114A produces the appropriate offset delay that may become necessary for the proper combination of the wet and dry chain components. In embodiments that utilize FIR bandpass filters, the delay generator 114A may be omitted or be configured to not to modify its input signal. Due to the linear phase characteristic of the FIR filters, all frequencies are subject to the same delay (i.e., the same number of samples) and, therefore, the dry chain delay compensator 118 may adequately compensate the delays associated with the wet chain 104. However, in embodiments that utilize IIR bandpass filters, the delay generator 114A can produces the required delay to compensate, at least partially, for the group delay associated with the IIR filters. Referring back to FIG. 1, the gain generator 116A produces the appropriate gain and applies it to the audio content that is input to the gain generator 116A. In one example, the gain generator 116A is configured as a constant gain multiplier. The gain value that is applied by the gain generator 116A can be tuned to achieve a desired level of harmonic content at its output and to prevent unwanted audio artifacts. For example, the gain generator 116A can apply gain values to avoid clipping of the output audio. The output of the gain generator 116A thus comprises spectrally shaped band 2 components that are appropriately scaled and comprise the proper offset delay (if needed).

Referring back to FIG. 1, the processing of the right-channel input audio 102B in the wet chain 104 can be conducted using similar audio processing components and similar audio processing procedures that were described in connection with the left-channel audio input 102A. In particular, the right-channel input audio 102B is processed by the first bandpass filter 106B to isolate the frequency components in band 1. Band 1 of the right-channel may span the same or different range of frequencies as band 1 of the left-channel. The output of the first bandpass filter 106B is then processed by the non-linear processor 108B, which produces higher order harmonics. A second bandpass filter 110B next isolates the higher order harmonics that reside in band 2 of the right-channel audio. Band 2 that is associated with the right-channel may span the same or different range of frequencies as band 2 of the left-channel. Spectral shaper 112B, delay generator 114B and gain generator 116B in the right-channel audio path process the audio content similar to the processes discussed in connection with the left-channel components.

Still referring to FIG. 1, in parallel with the wet channel processing, the input audio content is processed in the dry chain 128. In particular, the left-channel input audio 102A is processed by the group delay compensator 118. The group delay compensator 118 is configured to match the group delay associated with the various filters of left-channel audio in the wet chain 104. Further details regarding the various operations and components of the group delay compensator 118 will be discussed in the sections that follow. The output of the group delay compensator 118 that corresponds to the left audio channel is next scaled by the appropriate gain values in the gain generator 120A. Similarly, the right-channel audio input 102B is processed by the group delay compensator 118 to match the appropriate group delay associated with the wet-channel processing for this input channel. The output of the group delay compensator that is associated with the right channel is then scaled properly in the gain generator 120B. In one embodiment, the gain generator 120A and 120B apply suitable gain values to the dry chain audio channels to avoid clipping of the output audio (i.e., once combined with the wet channel components). In one example embodiment, the gain value of one or both gain generators 120A and 120B is set to unity. It should be noted that while a single block is used to depict the group delay compensator 118, this block may comprise separate components or blocks that are configured for processing the left- and the right-channel input audio signals, respectively.

Finally, the left-channel audio output 124A and the right-channel audio output 124B are generated by combining the outputs of the dry chain gain generators 120A and 120B with the outputs of the wet chain gain generators 116A and 116B, respectively. For example, the combiners 122A and 122B can be configured to add the dry and wet channel components. The output audio that is generated after the exemplary processing stages of FIG. 1 contains higher order harmonics that are associated with bass frequency contents of the input audio. These higher order harmonics are produced by the wet chain and are appropriately shaped, delayed and scaled to eliminate or reduce unwanted audio artifacts. The dry chain phase matching that is carried out by the group delay compensator 118 further compensates for the group of the wet chain IIR filters, thereby enabling seamless combination of the dry chain and wet chain audio channels to produce a high quality audio output. Such an output audio provides an enhanced listening experience that includes the perception of a rich bass signal even when with inexpensive speaker systems, such as the ones used in television sets and portable multimedia players.

It should be noted that in order to facilitate the understanding of the underlying concepts associated with the disclosed embodiments, the processing components or stages the wet and dry chains of FIG. 1 are depicted as separate blocks that operate on separate audio channels. However, it is understood that one of more of the depicted components may be combined with other components. One exemplary combination includes utilizing a single filter block to carry out bandpass filtering of the left and right channels. Alternatively, or additionally, the various blocks within the same or different processing chain(s) may comprise common components that are shared between those blocks. The disclosed system can also comprise additional components or blocks (not depicted in FIG. 1) that are used for carrying out common audio processing operations including, but not limited to, analog-to-digital (A/D) and digital-to-analog (D/A) conversions, normalization, equalization, resampling and the like. Further, while FIG. 1 illustrates the processing of stereo channels, it is understood that additional audio channels can be similarly processed. Moreover, it should be understood that additional connections between the various component of FIG. 1 may exists that have not been explicitly depicted for the sake of simplicity. For example, the component that are in the dry chain 128 can be in communication with at least some of the components that are located in the wet chain 104.

Figure 2:
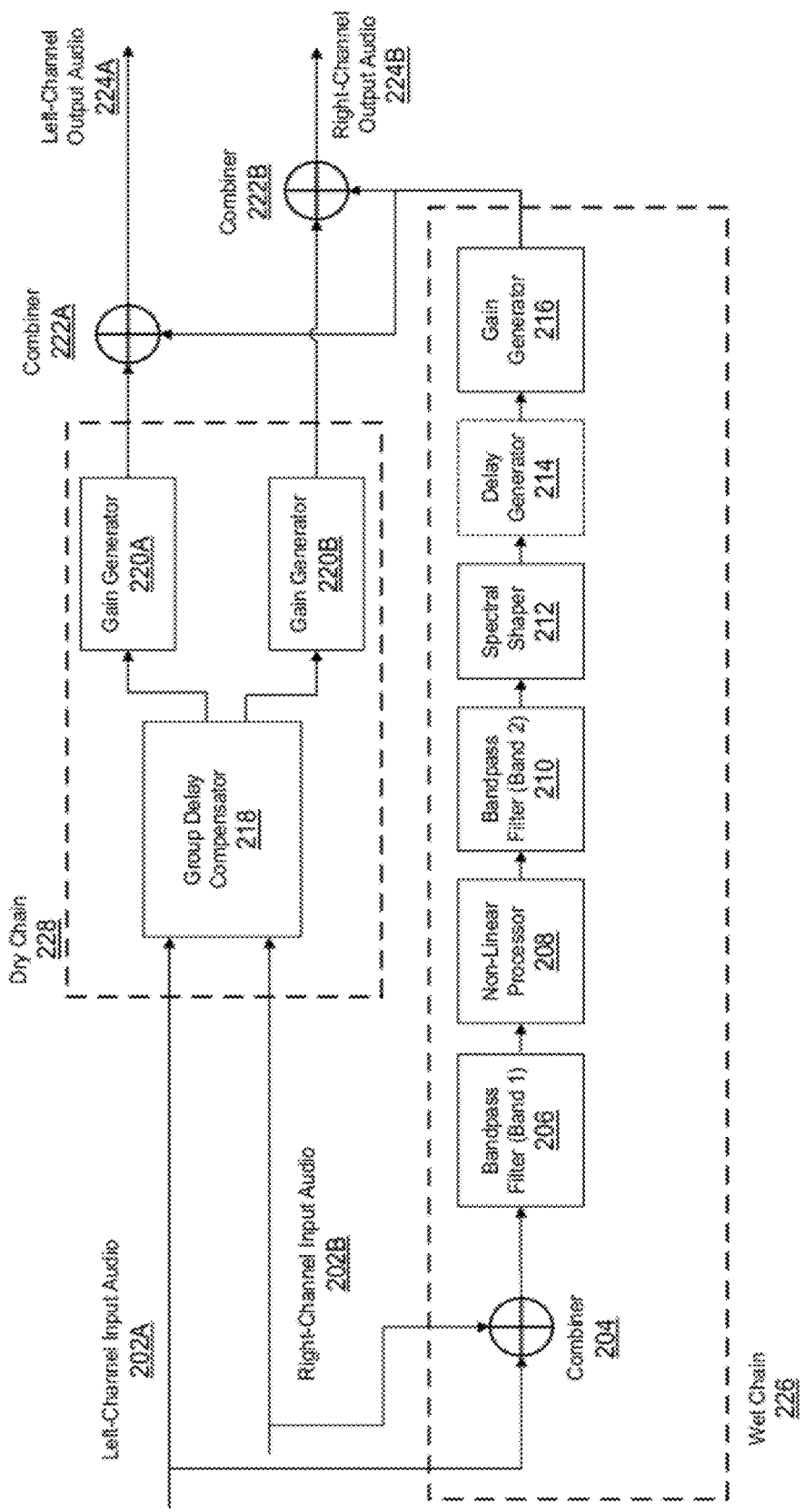
FIG. 2 illustrates another system that is used to generate an enhanced audio content in accordance with an example embodiment.

FIG. 2 illustrates an alternate embodiment of the present invention, in which the left-channel input audio 202A and the right-channel input audio 202B are first combined (e.g., added) by the combiner 204 and then processed by the first bandpass filter 206, the non-linear processor 208, the second bandpass filter 210, the spectral shaper 212, the delay generator 214 and the gain generator 216. These processing blocks perform similar operations as the ones discussed in connection with FIG. 1. Similar to FIG. 1, the dry chain processing is carried by matching the delays associated with the various stages of the wet chain in the group delay compensator 220. However, unlike the phase matching operation of FIG. 1, the group delay compensator only needs to account for the delays associated with the single path processing blocks of the wet chain 226. As such, the same group delay compensation is provided for both the left-channel input audio 202A and the right-channel input audio 202B. The gain generators 220A and 220B subject the phase-matched left and right audio channels to the appropriate scaling factors, respectively. Finally, the left-channel audio output 224A and the right-channel audio output 224B are generated by combining the output of the wet chain gain generator 216A to the outputs of the dry chain gain generators 220A and 220B. It is evident that, due to the single processing path of the wet chain 226, the exemplary embodiment that is depicted in FIG. 2 has a lower computational complexity than the one described in FIG. 1. However, the system of FIG. 1 may provide superior output audio quality, especially if the audio content of the left and the right input channels are sufficiently different from one another.

As noted above in connection with FIG. 1, FIR filters typically require more computational cycles and/or memory resources compared to their IIR counterparts. Therefore, the processing requirements for implementing FIR filters may render the implementation of such filters infeasible in certain applications. On the other hand, IIR filters that are used in audio processing applications may produce poor audio quality due to their non-linear phase characteristics. According to the disclosed embodiments, quasi-linear-phase low-order IIR filters can be used in place of the FIR filters. The multiple quasi-linear-phase low-order IIR filters consume significantly lower computational resources compared to the longer duration linear-phase FIR filters, while producing the desired linear (or quasi-linear) phase characteristic for the frequencies of interest. The audio signals that are processed using the disclosed quasi-linear-phase low-order IIR filters exhibit substantially improved objective and subjective audio quality when compared to the audio signals that are processed using arbitrary group-delay IIR filters. In some embodiments, quasi-linear-phase low-order IIR filters are designed and selected using the BU-method (i.e., a design procedure originally introduced by Harmut Brandenstein and Rolf Unbehauen in an article titled "Least-Squares Approximation of FIR by IIR Digital Filters," published in IEEE Transactions on Signal Processing, Vol. 46, No. 1, in January 1998). The IIR filters that are selected according to the BU-method can be selected to reasonably match the amplitude response of the corresponding FIR filter. Such IIR filters also produce a quasi-linear phase in the passband. However, the phase characteristics of the quasi-linear IIR filters still exhibit non-linearities in (e.g., deviations from an average value or a straight line phase characteristic) the passband of interest. Therefore, a simple integer delay in the dry chain cannot adequately align the dry chain and wet chain audio components. According to the disclosed embodiments, the group delay associated with the IIR filters in the wet chain are compensated in the wet chain using to enable the proper alignment of the wet and dry audio chains.

Figure 5:
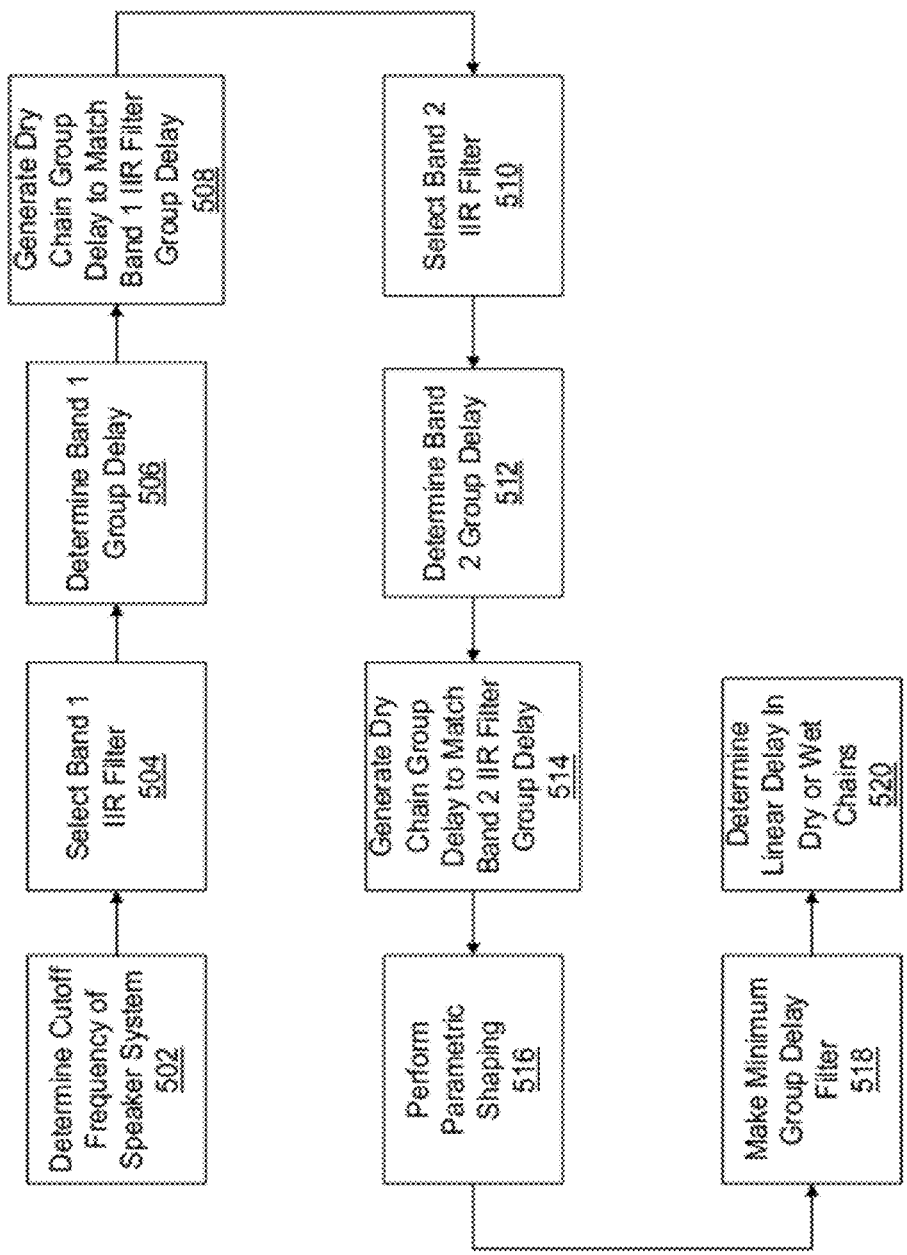
FIG. 5 illustrates a procedure for designing and selecting various components for processing an input audio content in accordance with an example embodiment.
Figure 6:
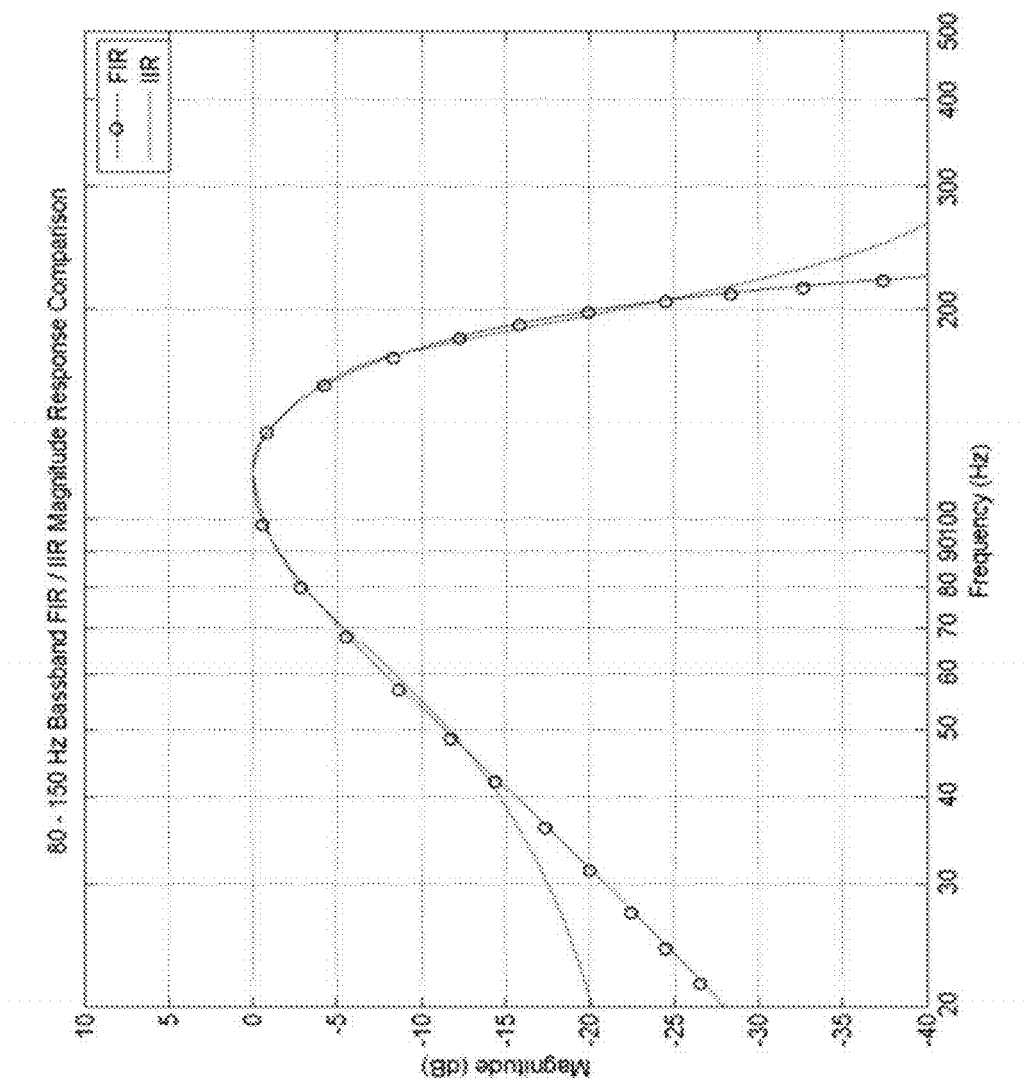
FIG. 6 illustrates magnitude plots associated with a finite impulse response (FIR) and an infinite impulse response (IIR) that are produced in accordance with an example embodiment.

FIG. 5 illustrate a procedure for the selection of the various filters and compensating the associated group delays in accordance with an example embodiment. At 502, the cutoff frequency, $f_C$, (e.g., the 3 dB frequency) point in speaker system is determined. The cutoff identifies an upper range of frequencies for the bass range of interest. The value of $f_C$ is used in subsequent operations to select a bandpass filter with proper characteristics. In one example, the value of $f_C$ is 150 Hz. At 504, an IIR filter for band 1 frequencies is selected. For example, band 1 frequencies may span 80-150 Hz. The filter at 504 can be designed and selected according to the BU-method and can include a quasi linear-phase IIR filter. Such a filter may also has a low decay rolloff (e.g., 10 dB per octave) for the selected band 1 frequencies. The IIR quasi linear-phase IIR filter at 504 is designed and selected to match the corresponding FIR filter's magnitude response. FIG. 6 shows the magnitude frequency response of the IIR and the FIR filters that are designed for the band 80-150 Hz in accordance with an exemplary embodiment.

Referring back to FIG. 5, at 506, the group delay associated with the band 1 IIR filter is determined. The concept of group delay can be better understood by considering the following. The output, y(t), of a linear, time-invariant system (such as the FIR's and IIR's that are described in the disclosed embodiments), which is characterized by a transfer function H(iw), for a complex sinusoid input, $x(t)=e^{iwt}$, is given by:

$$y(t) = H(iw)e^{iwt} \quad (1)$$
$$= (|H(iw)|e^{i\phi(w)})e^{iwt}$$
$$= |H(iw)|e^{i(wt+\phi(w))}.$$

The phase shift, $\phi(w)$, introduced by such a system, is defined as:

$$\phi(w) = arg\{H(iw)\} \quad (2).$$

The group delay, $\tau_g$, is determined by taking the negative of the first derivative of this phase shift:

$$\tau_g = -\frac{d\phi(w)}{dw}. \quad (3)$$

Figure 7:
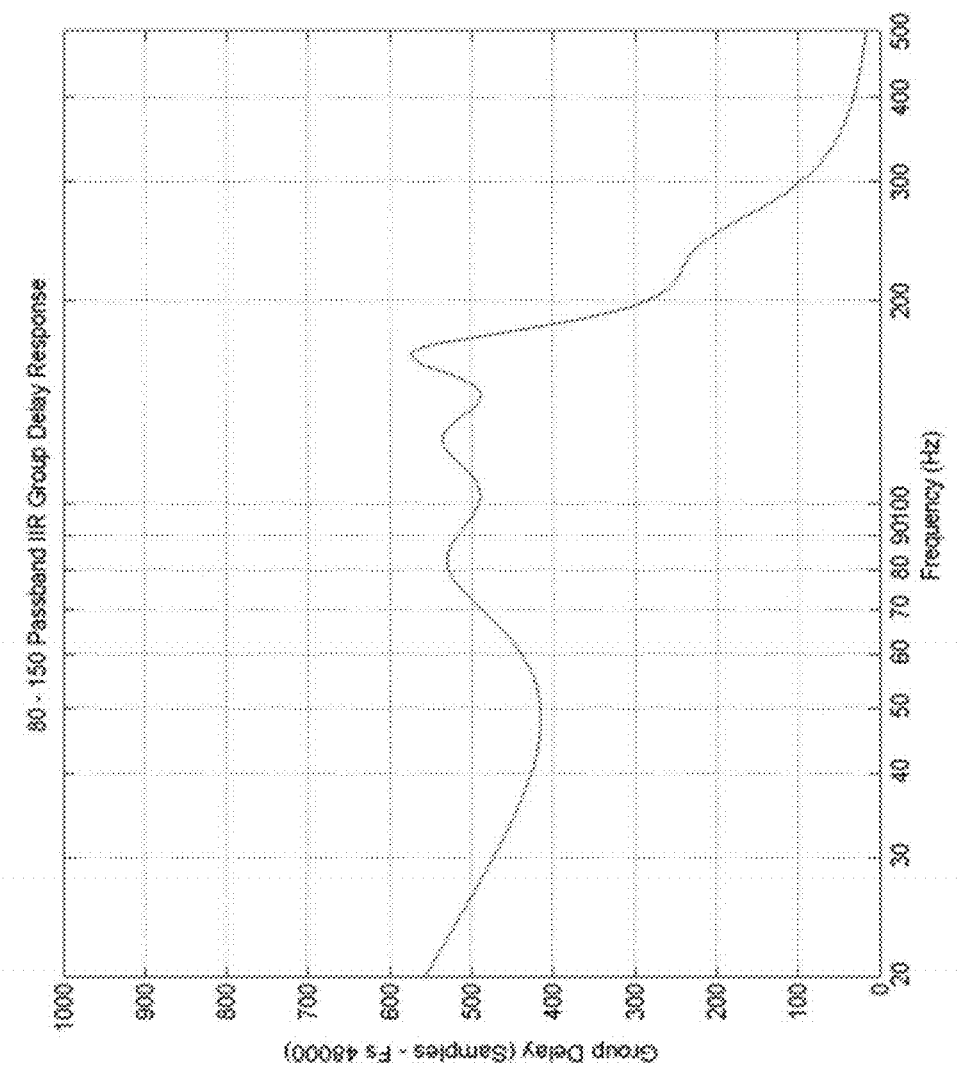
FIG. 7 illustrates a group delay associated with an IIR filter that is produced in accordance with an example embodiment.

The group delay associated with an exemplary IIR filter that is designed and selected for the band 80-159 Hz is depicted in FIG. 7.

At 508 in FIG. 5, a dry chain group delay is generated to match the band 1 group delay associated with the band 1 IIR filter. In one embodiment, a plurality of all-pass filters are used to produce the desired group delay in the dry chain. In particular, the dry chain group delay compensation can be designed in stages, where each stage uses a single second-order all-pass filter. Each all-pass filter, by definition, passes all frequencies equally in terms of magnitude. However, the all-pass filters can be tuned to produce a phase shift of varying degrees in certain range of frequencies. In one embodiment, a plurality of all-pass filters are configured in a cascade fashion, such that the output of a first all-pass filter is fed into the input of a second all-pass filter, the output of the second all-pass filter is fed into the input of a third all-pass filter and so on. In this fashion, each all-pass filter can be configured to control the phase of the audio content within a particular sub-region of the frequency band, thereby producing an aggregate group delay that matches the wet chain group delay over the frequency band of interest.

Figure 8:
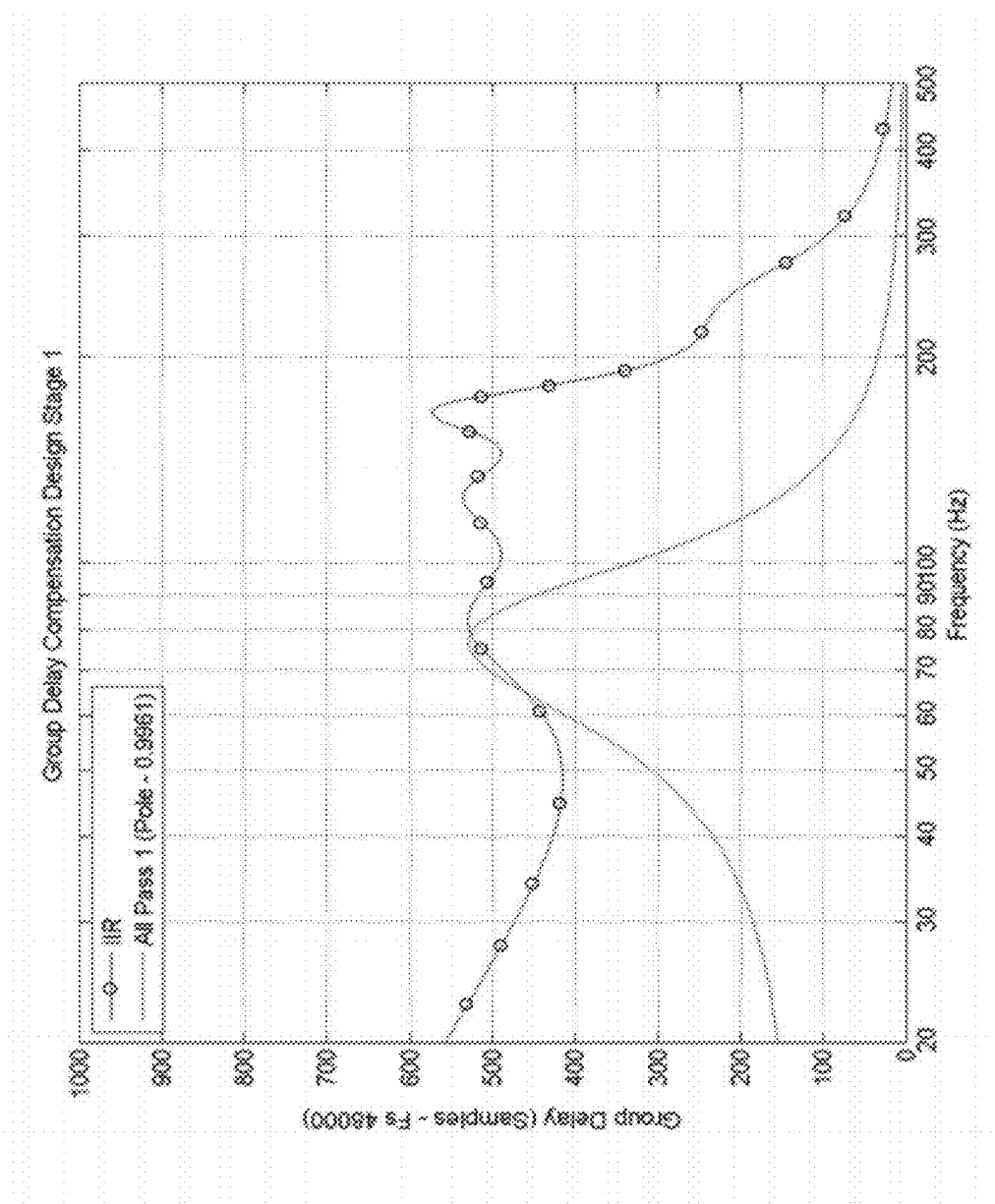
FIG. 8 illustrates group delay plots associated with the first stage of a delay compensation design procedure in accordance with an example embodiment.
Figure 9:
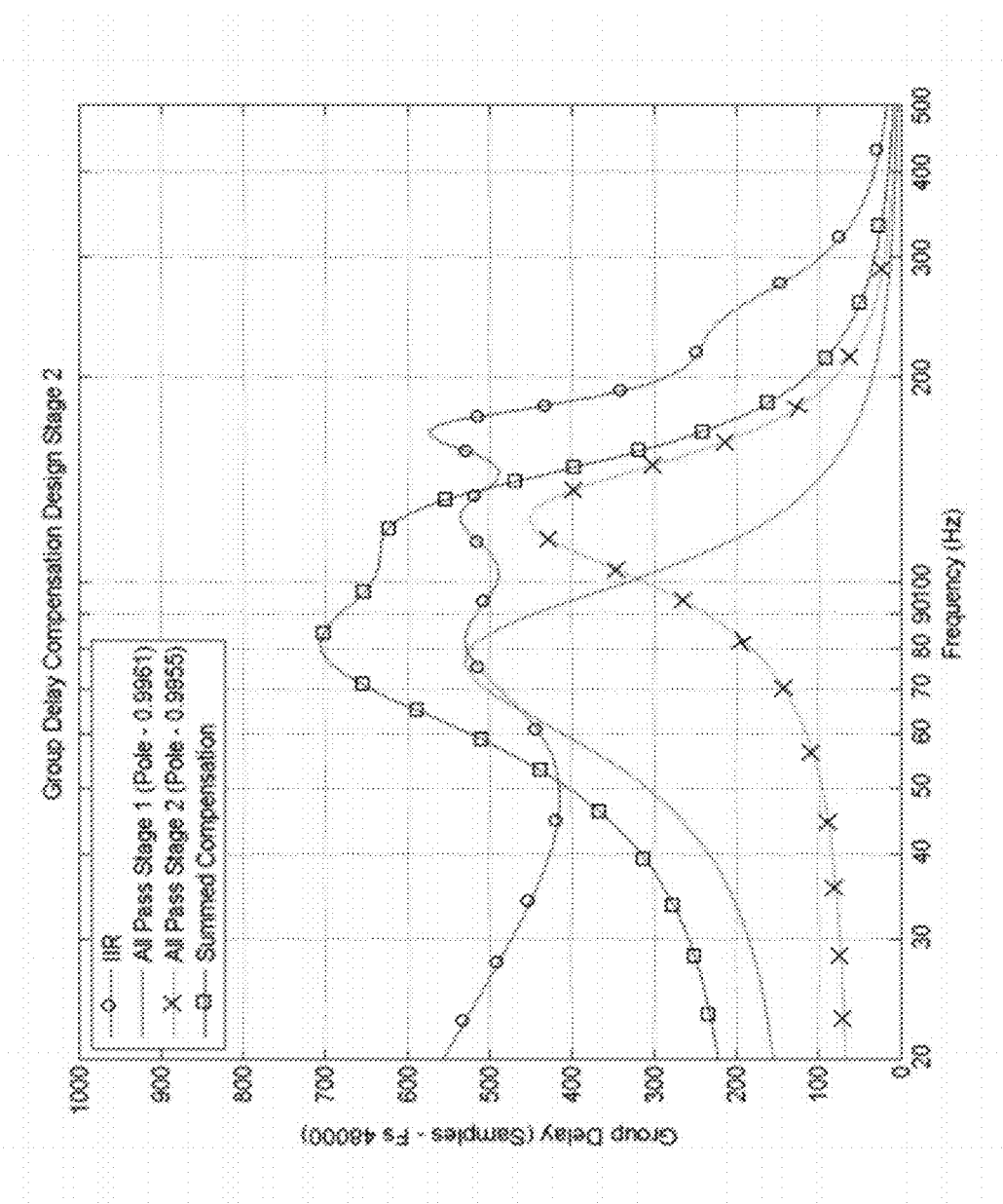
FIG. 9 illustrates group delay plots associated with the second stage of a delay compensation design procedure in accordance with an example embodiment.
Figure 10:
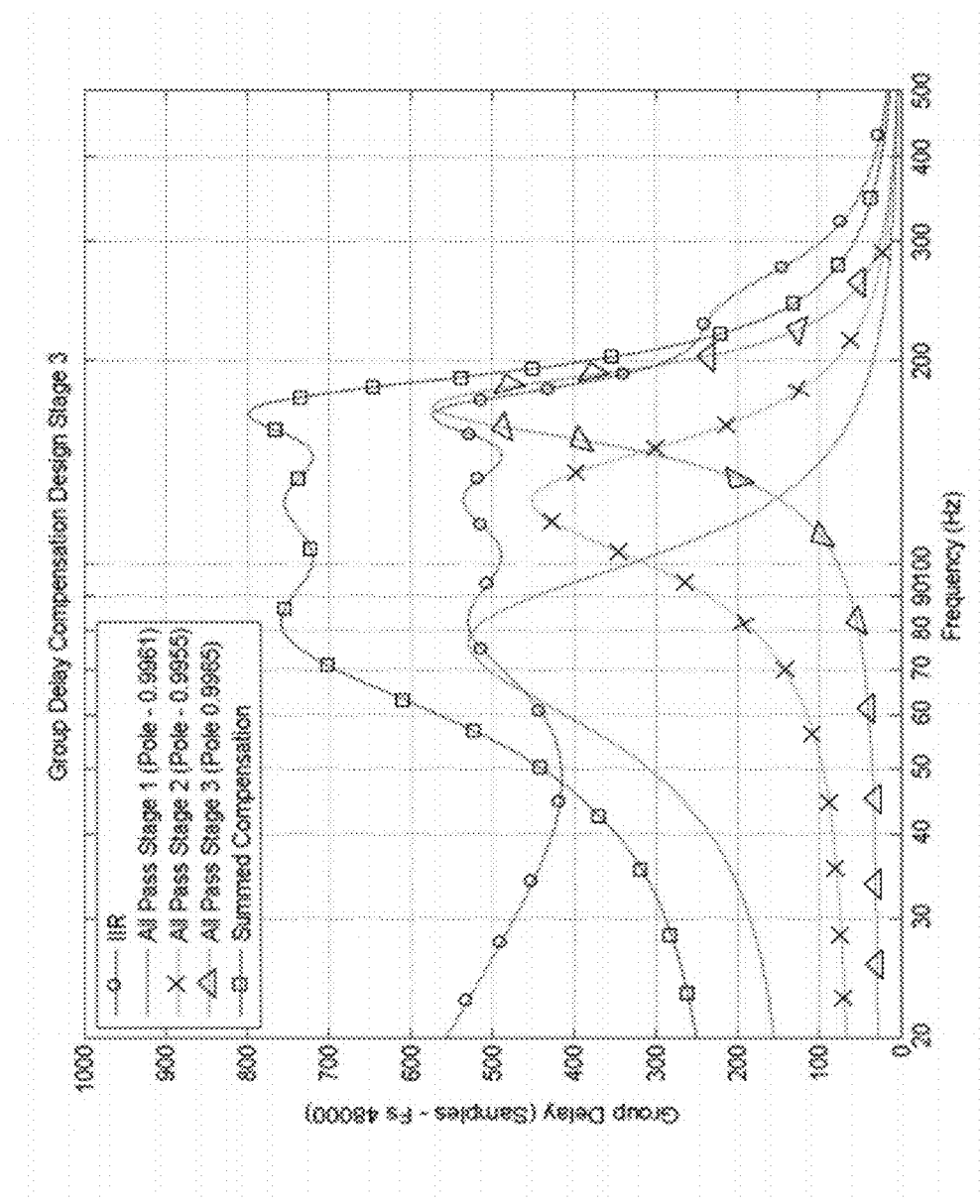
FIG. 10 illustrates group delay plots associated with the third stage of a delay compensation design procedure in accordance with an example embodiment.
Figure 11:
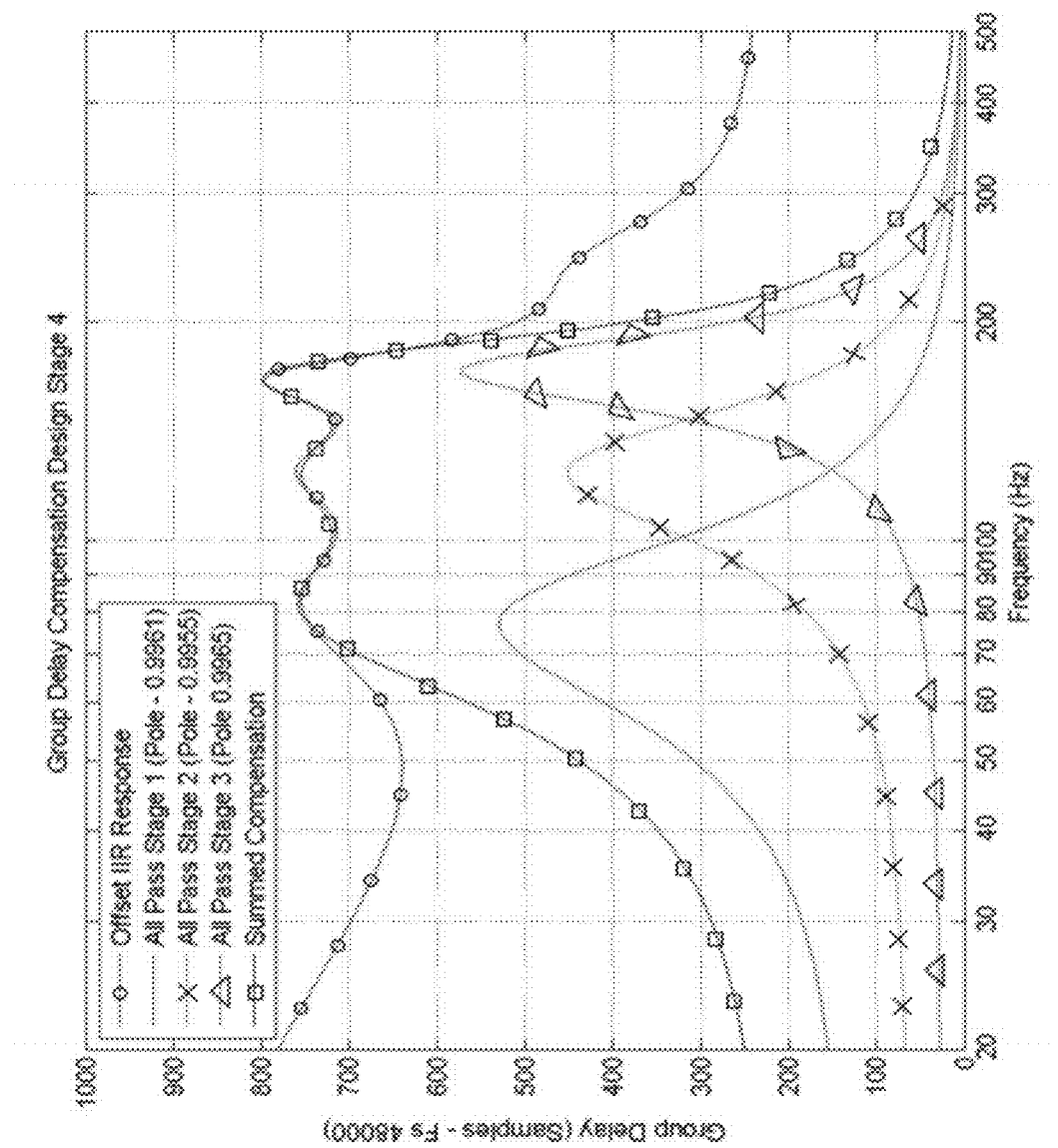
FIG. 11 illustrates group delay plots associated with the fourth stage of a delay compensation design procedure in accordance with an example embodiment.

FIGS. 8 through 11 illustrate the different stages of the dry chain delay generation for the band 80-150 Hz in accordance with an exemplary embodiment. In particular, FIG. 8 illustrates stage 1 of the design process where the group delay for wet chain IIR filter (i.e., also shown in FIG. 7) is plotted along with a group delay associated with a single second order all-pass filter. FIG. 9 illustrates the same two plots that are depicted in FIG. 8, in addition to the plot associated with a second-order all-pass filter that is used in stage 2 of the design process. FIG. 9 also depicts an aggregate group delay plot (i.e., labeled as "summed compensation") that is produced by adding the group delay plots of stage 1 and stage 2 all-pass filters. Examination of FIG. 9 reveals that the shape of the summed compensation plot is starting to resemble the IIR group delay. FIG. 10 shows stage 3 of the design, where an additional second-order all-pass filter is added. The "summed compensation" plot of FIG. 10 is produced by adding the group delay plots associated with all three all-pass filters. As is evident from FIG. 10, the summed compensation plot closely resembles the IIR group delay plot except for a constant delay value (i.e., a vertical shift) across all frequencies. FIG. 11 illustrates that the IIR filter group delay may be shifted to match the dry chain delay. This operation will be further discussed in connection with operation 520 of FIG. 5.

Referring back to FIG. 5, after the generation of the appropriate delay at 508, an IIR filter for band 2 is selected at 510. The selection of the IIR filter at 510 can be carried out similar to the operation discussed in connection with 504 for band 2 frequencies (e.g., 150-300 Hz). At 512, the group delay associated with band 2 IIR filter is determined and, at 514, the appropriate dry chain group delay is determined to match band 2 IIR filter group delay. Operations at 512 and 514 can be conducted similar to those discussed in connection with operations 506 and 508. At 516, parametric shaping is performed. As discussed in connection with the spectral shaper 112A in FIG. 1, the spectral shaping can be carried out to emphasizes the lower frequency components of the wet chain prior to the combination with the dry chain components. In one configuration, the parametric filter is centered around the lower cutoff frequency of band 2. The Q factor, which is the ratio of the filter's center frequency to its bandwidth, as well as the gain of the filter can be evaluated and tuned through listening tests.

At 518, the zeros of the parametric filter that was designed in operation 516 are transformed inside the unit circle to make the filter a minimum-group delay filter. A minimum group delay (and more generally a minimum-phase filter) has all of its poles and zeros within the unit circle and, therefore, is both stable and causal. At 520, the linear phase delay is determined for the wet and/or dry chains. As noted earlier in connection with FIG. 11, the aggregate group delay associated with the all-pass filters (e.g., in operations 508 and 514) can be offset from the desired wet chain group delay. In operation 520, the necessary linear delay is calculated to match the group delays of the two chains. The exemplary plots of FIG. 10 and FIG. 11 illustrate that the IIR group delay in the wet chain can be offset by a linear delay (e.g., a fixed number of samples) to align the group delays of the wet and dry chains.

It should be noted that the exemplary block diagram of FIG. 5 illustrates the matching of the group delays for each IIR filter that is conducted in separate operations 508 and 514. However, it is understood that the matching can be conducted based on the overall output of the wet chain. Further, the matching of the wet chain group delay was illustrated in the exemplary FIGS. 8-10 to comprise three stages. It is noted, however, that fewer or additional stages can be used to match the desired group delay characteristics.

Figure 12:
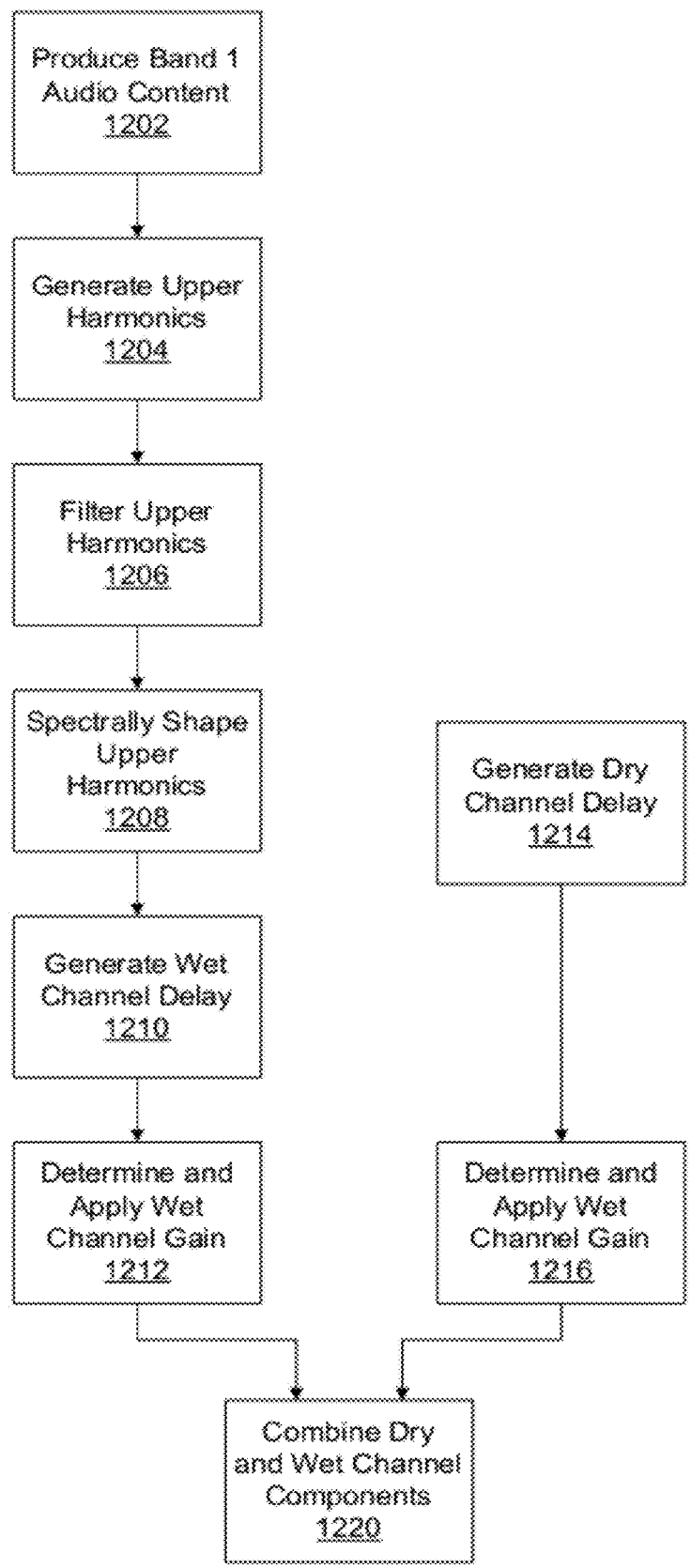
FIG. 12 is a block diagram of a procedure for producing an audio content containing higher order in accordance with an example embodiment.

FIG. 12 illustrates the operations that are conducted to produce a processed audio content containing higher order harmonics in accordance with an exemplary embodiment.

The wet chain operations are depicted as operations 1202 through 1212, whereas the dry chain operations are depicted as operations 1214 through 1216. At 1202, band 1 frequencies are produced by bandpass filtering a portion of the input audio content. At 1204, the upper harmonics associated with band 1 are generated. At 1206, the upper harmonics are bandpass filtered to isolate the harmonics that reside within band 2 of frequencies. At 1208, the filtered upper harmonics are spectrally shaped. For example, a parametric filter can be used to preferentially emaphasize a sub-band of frequencies (e.g., a lower sub-band of frequencies) within the band 2 frequency range. At 1210, the wet channel delay, if needed, is generated. At 1212, an appropriate gain is determined and applied to the wet chain audio components.

At 1214, as part of the dry chain processing, the appropriate dry chain delay is generated and applied to the input audio content. As described earlier, such a delay is intended to match the group delay associated with one or more of the IIR filters of the wet chain. At 1216, an appropriate gain is determined and applied to the dry chain audio components. In some embodiments, the application of only one of the wet channel gain (determined at 1212) or the dry channel gain (determined at 1216) may be sufficient for producing a properly scaled audio content. As such, one of the operations at 1212 or 1216 may be omitted. Finally, at 1220, the dry chain audio components and the wet chain audio components are combined to produce the final audio content.

Figure 13:
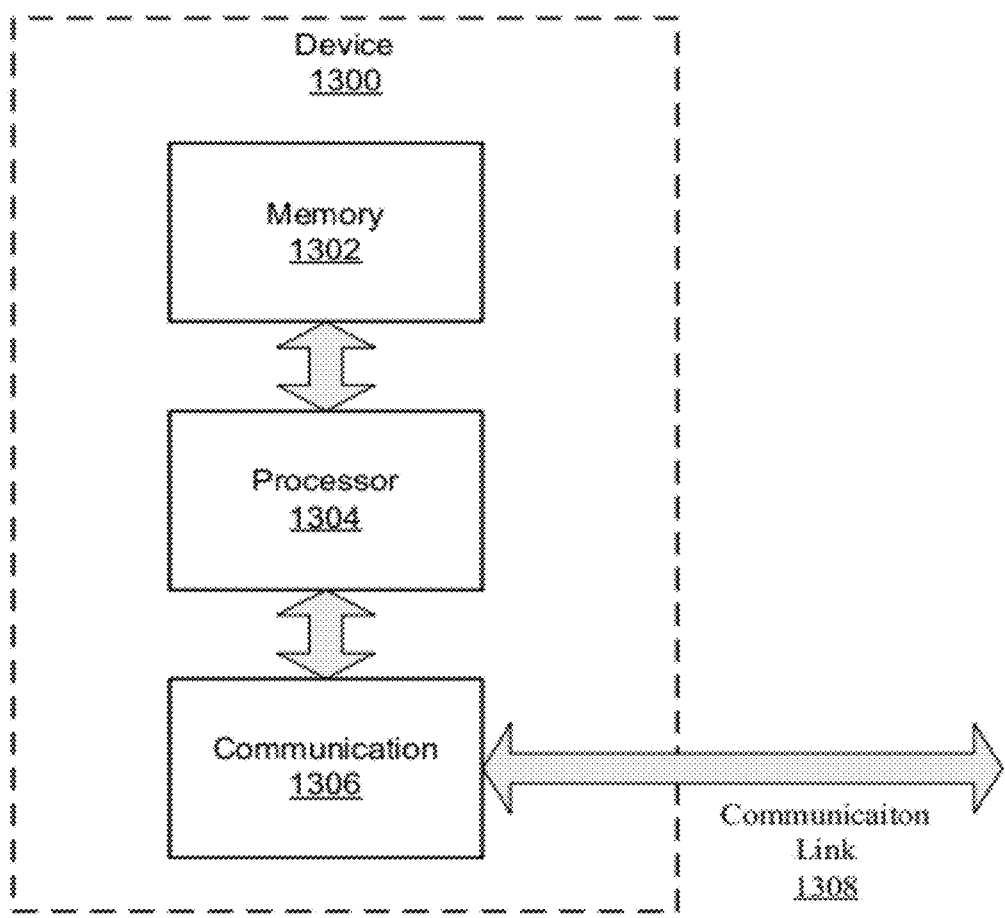
FIG. 13 illustrates a device within which the disclosed embodiments may be implemented.

It is understood that the disclosed embodiments may be implemented individually, or collectively, in devices comprised of various hardware and/or software modules and components. These devices, for example, may comprise a processor, a memory unit, an interface that are communicatively connected to each other, and may range from desktop and/or laptop computers, to consumer electronic devices such as media players, mobile devices and the like. For example, FIG. 13 illustrates a block diagram of a device 1300 within which the various disclosed embodiments may be implemented. The device 1300 comprises at least one processor 1302 and/or controller, at least one memory 1304 unit that is in communication with the processor 1302, and at least one communication unit 1306 that enables the exchange of data and information, directly or indirectly, through the communication link 1308 with other entities, devices and networks. The communication unit 1306 may provide wired and/or wireless communication capabilities in accordance with one or more communication protocols, and therefore it may comprise the proper transmitter/receiver antennas, circuitry and ports, as well as the encoding/decoding capabilities that may be necessary for proper transmission and/or reception of data and other information. The exemplary device 1300 that is depicted in FIG. 13 may incorporate some or all of the components that are depicted in FIGS. 1 and 2.

Similarly, the various components or sub-components within each module that is depicted in FIGS. 1 and 2 may be implemented in software, hardware or firmware. The connectivity between the modules and/or components within the modules may be provided using any one of the connectivity methods and media that is known in the art, including, but not limited to, communications over the Internet, wired, or wireless networks using the appropriate protocols.

Various embodiments described herein are described in the general context of methods or processes, which may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Therefore, the computer-readable media that is described in the present application comprise non-transitory storage media. Generally, program modules may include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represents examples of corresponding acts for implementing the functions described in such steps or processes.

The foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and its practical application to enable one skilled in the art to utilize the present invention in various embodiments and with various modifications as are suited to the particular use contemplated. The features of the embodiments described herein may be combined in all possible combinations of methods, apparatus, modules, systems, and computer program products.

What is claimed is:

1. A method, comprising:
   receiving, via a communication link, an input audio content;
   performing by a processor a wet chain processing on the input audio content, the wet chain processing comprising:
   isolating by filtering, by the processor, a first band of frequencies to be compensated, from the input audio content;
   producing by the processor from the isolated first frequency band upper harmonics of the frequencies to be compensated and in the first frequency band of the input audio content, the upper harmonics being located in a second frequency band; and
   filtering by the processor the upper harmonics using an infinite impulse response bandpass filter to produce a wet chain audio component;
   determining by the processor: (i) a stage one group delay corresponding to the first frequency band, and (ii) a stage two group delay corresponding to the second frequency band;
   performing by the processor a dry chain processing on the input audio content, the dry chain processing comprising:
   generating by the processor an aggregated dry chain group delay to match a wet chain group delay associated with the infinite impulse response bandpass filter, the aggregated dry chain group delay being based on, at least in part, both the stage one and stage two group delays; and
   applying by the processor the aggregated dry chain group delay to the input audio content to produce a dry chain audio component; and
   combining by the processor the wet chain audio component with the dry chain audio component,
   at least one of the first band of frequencies, the upper harmonics, the wet chain audio component, the stage one and stage two group delays, the aggregated dry chain group delay, and the dry chain component being stored in a memory coupled to the processor.

2. The method of claim 1, wherein the dry chain group delay is generated using at least one all-pass filter to produce a group delay in the second band of frequencies that matches the group delay associated with the infinite impulse response bandpass filter.

3. The method of claim 2, wherein
each all-pass filter is a second-order all-pass filter; and
each all pass filter is configured to exhibit a particular group delay characteristic in a sub-band of frequencies within the second band of frequencies.

4. The method of claim 1, wherein the wet chain processing comprises filtering the input audio content to produce the first band of frequencies.

5. The method of claim 4, wherein the first band of frequencies is produced using a first infinite impulse response filter.

6. The method of claim 5, wherein the dry chain processing comprises generating the dry chain group delay by matching a wet chain group delay associated with the first infinite impulse response bandpass filter.

7. The method of claim 1, wherein the wet chain processing comprises spectral shaping an output of the infinite impulse response bandpass filter to produce the wet chain audio component.

8. The method of claim 7, wherein the spectral shaping is carried out using a parametric filter.

9. The method of claim 8, wherein the parametric filter is configured to emphasize a lower sub-band of frequencies within the second band of frequencies.

10. The method of claim 1, wherein the wet chain processing comprises generating and applying an offset delay to a signal based on the infinite impulse response bandpass filter output to produce the wet chain audio component prior to the combining thereof with the dry chain component, the offset delay representing a difference between the aggregated dry-chain group delay corresponding to the first frequency band and a wet-chain group delay corresponding to the first frequency band.

11. The method of claim 1, wherein the wet chain processing comprises generating and applying a gain to a signal based on the infinite impulse response bandpass filter output to produce the wet chain audio component prior, to the combining thereof with the dry chain audio component.

12. The method of claim 1, wherein the dry chain processing comprises generating and applying a gain to an output of a delay compensator to produce the dry chain audio component, prior to the combining thereof with the wet chain audio component.

13. The method of claim 1, wherein
the input audio content is a single-channel audio content; and
the dry chain processing and wet chain processing are carried out on the single-channel audio content.

14. The method of claim 1, wherein
the input audio content is a multi-channel audio content;
the dry chain processing and wet chain processing are carried out on individual channels of the multi-channel audio content; and
combining the wet chain audio component with the dry chain audio component comprises combining each processed dry chain individual channel with respective processed wet chain individual channel.

15. The method of claim 1, wherein
the input audio content is a multi-channel audio content; the dry chain processing is carried out on individual channels of the multi-channel audio content;
at least a portion of the wet chain processing is carried out on a combined audio content that comprises two or more of the channels of the multi-channel audio content to produce the wet chain audio component; and
combining the wet chain audio component with the dry chain audio component comprises combining each processed dry chain individual channel with the wet chain audio component.

16. A device, comprising:
a processor; and
a memory, comprising processor executable code, the processor executable code, when executed by the processor, configures the device to:
receive, via a communication link, an input audio content;
perform a wet chain processing on the input audio content by configuring the device to:
isolate by filtering, a first band of frequencies to be compensated, from the input audio content;
produce from the isolated first frequency band upper harmonics of the frequencies to be compensated and in the first frequency band of the input audio content, the upper harmonics being located in a second frequency band; and
filter the upper harmonics using an infinite impulse response bandpass filter to produce a wet chain audio component;
determine: (i) a stage one group delay corresponding to the first frequency band, and (ii) a stage two group delay corresponding to the second frequency band;
perform a dry chain processing on the input audio content by configuring the device to:
generate an aggregated dry chain group delay to match a wet chain group delay associated with the infinite impulse response bandpass filter, the aggregated dry chain group delay being based on, at least in part, both the stage one and stage two group delays; and
apply the aggregated dry chain group delay to the input audio content to produce a dry chain audio component; and
combine the wet chain audio component with the dry chain audio component,
at least one of the first band of frequencies, the upper harmonics, the wet chain audio component, the stage one and stage two group delays, the aggregated dry chain group delay, and the dry chain component being stored in the memory.

17. The device of claim 16, wherein the dry chain group delay is generated using at least one all-pass filter configured to produce a group delay in the second band of frequencies that matches the group delay associated with the infinite impulse response bandpass filter.

18. The device of claim 17, wherein
each all-pass filter is a second-order all-pass filter; and
each all pass filter is configured to exhibit a particular group delay characteristic in a sub-band of frequencies within the second band of frequencies.

19. The device of claim 16, wherein, as part of the wet chain processing, the processor executable code, when executed by the processor, configures the device to filter the input audio content to produce the first band of frequencies.

20. The device of claim 19, wherein the first band of frequencies is produced by a first infinite impulse response filter.

21. The device of claim 20, wherein, as part of the dry chain processing, the processor executable code, when executed by the processor, configures the device to generate the dry chain group delay by matching a wet chain group delay associated with the first infinite impulse response bandpass filter.

22. The device of claim 16, wherein, as part of the wet chain processing, the processor executable code, when executed by the processor, configures the device to spectrally shape an output of the infinite impulse response bandpass filter to produce the wet chain audio component.

23. The device of claim 22, wherein a parametric filter is used to carry out the spectral shaping.

24. The device of claim 23, wherein the parametric filter is configured to emphasize a lower sub-band of frequencies within the second band of frequencies.

25. The device of claim 16, wherein, as part of the wet chain processing, the processor executable code, when executed by the processor, configures the device to generate and apply an offset delay to a signal based on the infinite impulse response bandpass filter output to produce the wet chain audio component, prior to the combination thereof with the dry chain audio component, the offset delay representing a difference between the aggregated dry-chain group delay corresponding to the first frequency band and a wet-chain group delay corresponding to the first frequency band.

26. The device of claim 16, wherein, as part of the wet chain processing, the processor executable code, when executed by the processor, configures the device to generate and apply a gain to a signal based on the infinite impulse response bandpass filter output to produce the wet chain audio component prior to the combination thereof with the dry chain audio component.

27. The device of claim 16, wherein, as part of the dry chain processing, the processor executable code, when executed by the processor, configures the device to generate and apply a gain to an output of a delay compensator to produce the dry chain audio component, prior to the to the combination thereof with the wet chain audio component.

28. The device of claim 16, wherein
the input audio content is a single-channel audio content; and
the processor executable code, when executed by the processor, configures the device the device to carry out the dry chain processing and wet chain processing on the single-channel audio content.

29. The device of claim 16, wherein
the input audio content is a multi-channel audio content;
the processor executable code, when executed by the processor, configures the device the device to carry out the dry chain processing and the wet chain processing on individual channels of the multi-channel audio content; and
the combination of the wet chain audio component with the dry chain audio component comprises a combination of each processed dry chain individual channel with respective processed wet chain individual channel.

30. The device of claim 16, wherein
the input audio content is a multi-channel audio content; and
the processor executable code, when executed by the processor, configures the device the device to carry out the dry chain processing on individual channels of the multi-channel audio content, and at least a portion of the wet chain processing on a combined audio content that comprises two or more of the channels of the multi-channel audio content to produce the wet chain audio component; and the combination of the wet chain audio component with the dry chain audio component comprises a combination of each processed dry chain individual channel with the wet chain audio component.

31. A computer program product, embodied on a non-transitory computer readable medium, comprising:
computer code for receiving, via a communication link, an input audio content;
computer code for performing a wet chain processing on the input audio content, the wet chain processing comprising:
isolating by filtering, a first band of frequencies to be compensated, from the input audio content;
producing from the isolated first frequency band upper harmonics of the frequencies to be compensated and in the first frequency band of the input audio content, the upper harmonics being located in a second frequency band; and
filtering the upper harmonics using an infinite impulse response bandpass filter to produce a wet chain audio component;
computer code for determining: (i) a stage one group delay corresponding to the first frequency band, and (ii) a stage two group delay corresponding to the second frequency band;
computer code for performing a dry chain processing on the input audio content, the dry chain processing comprising:
generating a dry chain group delay to match a wet chain group delay associated with the infinite impulse response bandpass filter, the aggregated dry chain group delay being based on, at least in part, both the stage one and stage two group delays; and
applying the aggregated dry chain group delay to the input audio content to produce a dry chain audio component;
computer code for combining the wet chain audio component with the dry chain audio component; and
computer code for storing at least one of the first band of frequencies, the upper harmonics, the wet chain audio component, the stage one and stage two group delays, the aggregated dry chain group delay, and the dry chain component in a memory.

32. The computer program product of claim 31, wherein the dry chain group delay is generated using at least one all-pass filter to produce a group delay in the second band of frequencies that matches the group delay associated with the infinite impulse response bandpass filter.

33. The computer program product of claim 32, wherein each all-pass filter is a second-order all-pass filter; and
each all pass filter is configured to exhibit a particular group delay characteristic in a sub-band of frequencies within the second band of frequencies.

34. The computer program product of claim 31, wherein the wet chain processing comprises filtering the input audio content to produce the first band of frequencies.

35. The computer program product of claim 34, wherein the first band of frequencies is produced using a first infinite impulse response filter.

36. The computer program product of claim 35, wherein the dry chain processing comprises generating the dry chain group delay by matching a wet chain group delay associated with the first infinite impulse response bandpass filter.

* * * * *